United States Patent
Nagashima et al.

(10) Patent No.: US 7,952,931 B2
(45) Date of Patent: May 31, 2011

(54) NONVOLATILE SEMICONDUCTOR MEMORY DEVICE WHICH REALIZES "1" WRITE OPERATION BY BOOSTING CHANNEL POTENTIAL

(75) Inventors: Hiroyuki Nagashima, Yokohama (JP); Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/132,426

(22) Filed: Jun. 3, 2008

(65) Prior Publication Data

US 2008/0304324 A1 Dec. 11, 2008

(30) Foreign Application Priority Data

Jun. 4, 2007 (JP) .................................. 2007-148205

(51) Int. Cl.
*G11C 11/34* (2006.01)
(52) U.S. Cl. .......... 365/185.18; 365/185.28; 365/189.11
(58) Field of Classification Search ............. 365/185.18, 365/185.28, 189.11
See application file for complete search history.

(56) References Cited

U.S. PATENT DOCUMENTS

| 7,161,833 | B2 | 1/2007 | Hemink |
| 7,259,991 | B2 | 8/2007 | Aritome |
| 7,304,894 | B2 | 12/2007 | Joo |
| 2008/0084747 | A1 * | 4/2008 | Hemink et al. .......... 365/185.18 |

FOREIGN PATENT DOCUMENTS

JP 2001-332093 11/2001
* cited by examiner

*Primary Examiner* — Huan Hoang
*Assistant Examiner* — Jason Lappas
(74) *Attorney, Agent, or Firm* — Oblon, Spivak, McClelland, Maier & Neustadt, L.L.P.

(57) ABSTRACT

A nonvolatile semiconductor memory device includes a memory cell array having a plurality of cell units each including a preset number of memory cells and select gate transistors on drain and source sides. The nonvolatile semiconductor memory device includes a voltage control circuit to prevent occurrence of an erroneous write operation due to excessively high boost voltage of a channel when "1" is written into the memory cell.

12 Claims, 11 Drawing Sheets

NONVOLATILE SEMICONDUCTOR MEMORY DEVICE WHICH REALIZES "1" WRITE OPERATION BY BOOSTING CHANNEL POTENTIAL

CROSS-REFERENCE TO RELATED APPLICATIONS

This application is based upon and claims the benefit of priority from prior Japanese Patent Application No. 2007-148205, filed Jun. 4, 2007, the entire contents of which are incorporated herein by reference.

BACKGROUND OF THE INVENTION

1. Field of the Invention

This invention relates to a nonvolatile semiconductor memory device and more particularly to a nonvolatile semiconductor memory device having a plurality of cell units each including a preset number of memory cells and select gate transistors on the drain and sources side as is represented by a NAND flash memory, for example.

2. Description of the Related Art

In the case of a NAND flash memory, generally, the write operation is realized by boosting channel potential with respect to a cell (non-selected cell or write inhibition cell) into which "1" is to be written. At this time, an erroneous write operation occurs if boost voltage applied to the word line is set high to a certain extent.

In the present NAND flash memory, the probability of occurrence of an erroneous write operation in a cell connected to a word line WL (for example, word line WL0) adjacent to a select gate line SGS on the source side is higher in comparison with that in a cell connected to another word line WL. This is considered because boost voltage applied to word line WL0 is temporarily set to excessively high voltage. Particularly, when data is written into a cell connected to word line WL0 and if data is not yet written into cells connected to the succeeding cells WL1 ~, cells that obstruct formation of a channel are not present, and therefore, there occurs a possibility that boost voltage applied to word line WL0 is set to voltage higher than normal. For this reason, conventionally, there occurs a problem that an erroneous write operation with respect to the cell connected to word line WL0 tends to occur due to a gate-induced drain leakage (GIDL) current generated on the source side or source side injection current.

A nonvolatile semiconductor memory in which a lowering in the write inhibition potential due to a leakage current is prevented is already proposed (see, for example, Jpn. Pat. Appln. KOKAI Publication No. 2001-332093).

BRIEF SUMMARY OF THE INVENTION

According to a first aspect of the present invention, there is provided a nonvolatile semiconductor memory device comprising a memory cell array having a plurality of cell units each including a preset number of memory cells and select gate transistors on drain and source sides, and a voltage control circuit which prevents occurrence of an erroneous write operation due to excessively high boost voltage of a channel at the time of writing "1" into the memory cell.

According to a second aspect of the present invention, there is provided a nonvolatile semiconductor memory device comprising a memory cell array having at least one cell unit including a plurality of memory cells and select gate transistors on drain and source sides, and a voltage control circuit which prevents occurrence of an erroneous write operation due to excessively high boost voltage of a channel when "1" is written into the memory cell connected to an adjacent word line in a case where word lines are respectively connected to the plurality of memory cells and a write operation with respect to the memory cells connected to the word lines other than the adjacent word line which lies adjacent to the select gate transistor on the source side is not yet performed.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
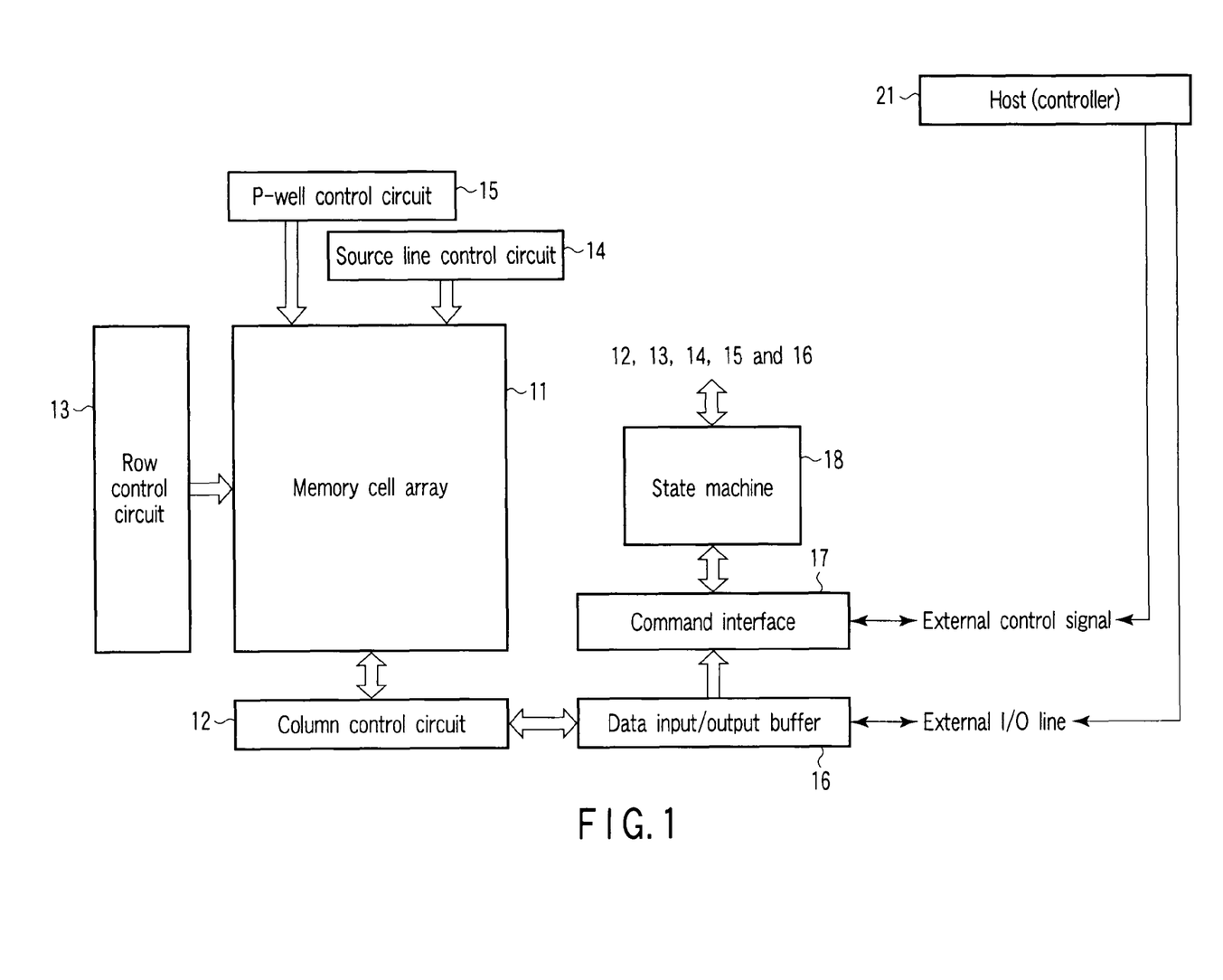
FIG. 1 is a block diagram showing an example of the configuration of a core portion of a nonvolatile semiconductor memory device (NAND flash memory) according to a first embodiment of this invention.

FIG. 1 shows an example of the configuration of a nonvolatile semiconductor memory device according to a first embodiment of this invention. In the present embodiment, a NAND flash memory is taken as an example and explained as the nonvolatile semiconductor memory device.

In FIG. 1, a memory cell array 11 is configured to have a plurality of flash memory cells arranged in a matrix form. A column control circuit 12 and row control circuit 13 are provided near the memory cell array 11. The column control circuit 12 controls bit lines to erase data held in the memory cell, write data into the memory cell or reads out data from the memory cell. The row control circuit 13 selectively applies potentials required for erasing, writing and readout to word lines and select gate transistors.

Further, a source line control circuit 14 which controls the potential of the source line and a P-well control circuit 15 which controls the potential of a p-type well in which the memory cell array 11 is formed are provided near the memory cell array 11.

A data input/output buffer 16 is connected to an external host (controller) 21 via an external input/output (I/O) line to receive write data, address data and command data from the host 21 and output readout data to the host 21. That is, the data input/output buffer 16 transmits write data received from the host 21 via the external I/O line to the column control circuit 12. Further, it receives readout data that is read out from the memory cell array 11 from the column control circuit 12 and outputs the same to the host 21 via the external I/O line. In addition, it transmits address data and command data from the host 21 to a command interface 17 to select the memory cell.

The command interface 17 receives an external control signal from the host 21, determines whether data received from the data input/output buffer 16 is command data or address data and transfers the data to a state machine 18.

The state machine 18 manages the whole portion of the flash memory. That is, it manages the read, write and erase operations and a data input/output operation according to command data from the host 21. For example, the state machine 18 transmits address data received from the command interface 17 to the column control circuit 12 and row control circuit 13.

Figure 2:
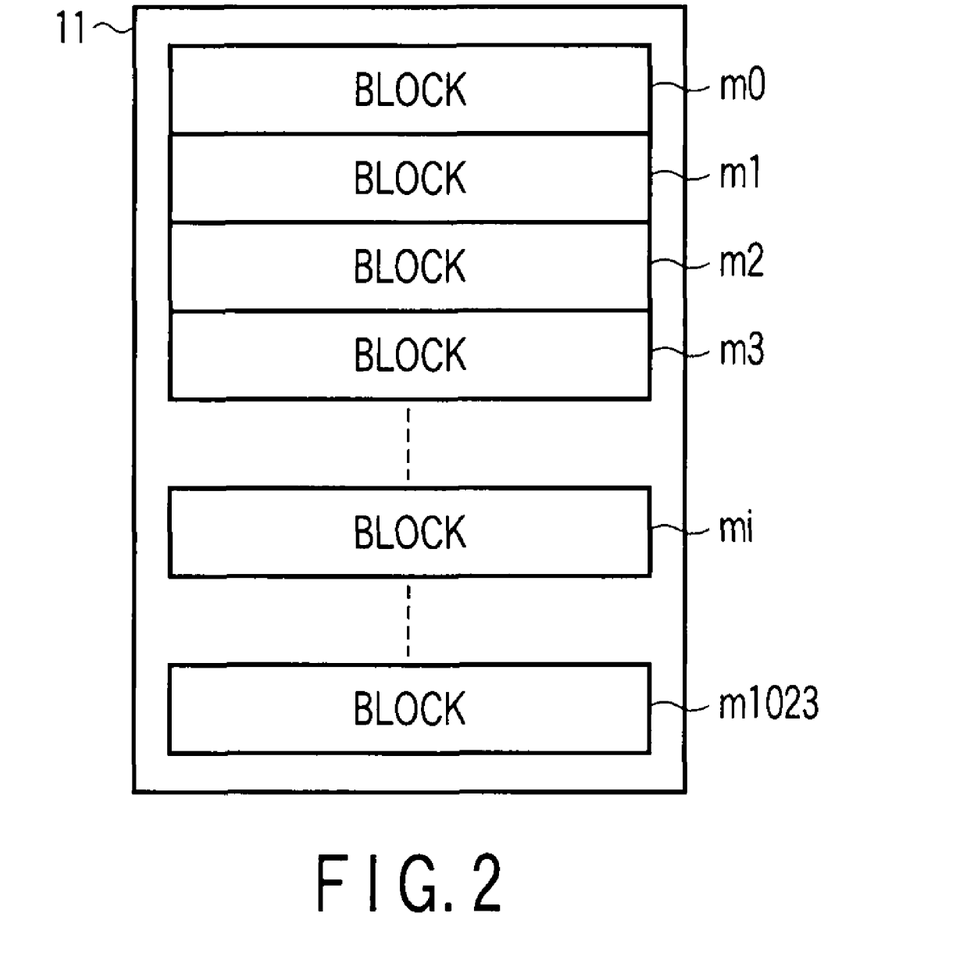
FIG. 2 is a configuration diagram showing one example of a memory cell array of the NAND flash memory shown in FIG. 1.

FIG. 2 shows a configuration example of the memory cell array 11. The internal portion of the memory cell array 11 is divided into a plurality of (in this example, 1024) blocks BLOCKm0 to BLOCKm1023. The block indicates the minimum unit that can be simultaneously erased.

Figure 3:
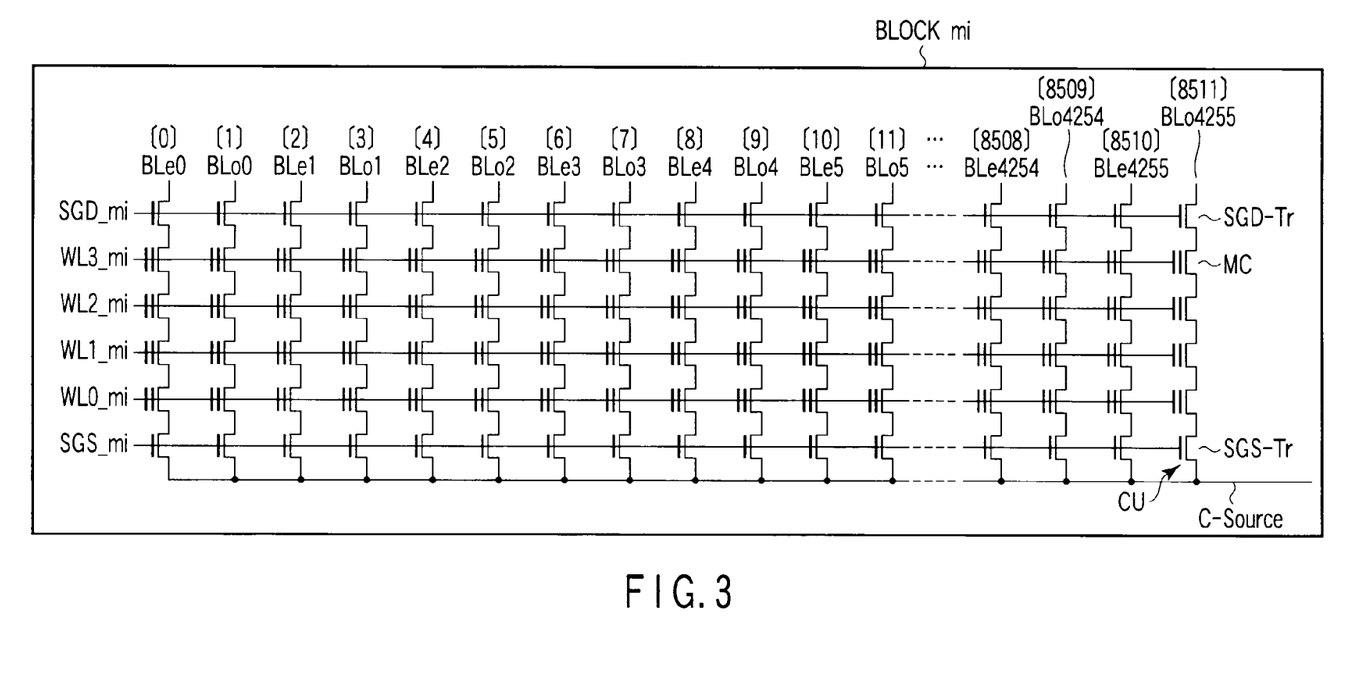
FIG. 3 is a configuration diagram showing one example of a block in the memory cell array shown in FIG. 2.

FIG. 3 shows a configuration example of blocks BLOCKm0 to BLOCKm1023. Blocks BLOCKm0 to BLOCKm1023 have the same configuration and one block BLOCKmi is taken and explained in this example.

In the case of the present embodiment, block BLOCKmi is configured by 8512 NAND memory units (which are also called cell units or NAND strings) CU. For example, each of the NAND memory units CU has a configuration in which a NAND string formed by serially connecting four memory cells MC is provided. One-side ends of the NAND strings are connected to bit lines BL (BLej, BLoj) via drain-side select gate transistors SGD-Tr (in this example, j=0, 1, 2, . . . , 4255). The other ends of the NAND strings are connected to a common source line C-Source via source-side select gate transistors SGS-Tr. That is, each of the NAND memory units CU is configured by one NAND string (a preset number of memory cells MC) and two select gate transistors SGD-Tr, SGS-Tr.

In block BLOCKmi, a select gate line SGD_mi is commonly connected to the gates of the select gate transistors SGD-Tr of the respective NAND memory units CU. Also, a select gate line SGS_mi is commonly connected to the gates of the select gate transistors SGS-Tr.

Each of the memory cells MC is a MOS transistor having a double-layered gate electrode structure formed by laminating a floating gate and control gate and the memory cells are arranged (serially connected) in each NAND string so that the source and drain of the adjacent memory cells can be commonly used. Data is rewritten (written and erased) into the memory cells MC by injecting or discharging charges (electrons) with respect to the floating gate by means of an FN tunnel current. Generally, the state in which electrons are injected into the floating gate is set as a "0" written state and the state in which electrons are not injected therein is set as a "1" written state.

The control gates of the four memory cells of the respective NAND memory units CU are commonly connected to common word lines WLi_mi. For example, the word lines WLi_mi are arranged in an order of word lines WL0_mi, WL1_mi, WL2_mi and WL3_mi from the source side.

In this case, the data write operation and read operation are independently performed for even-numbered bit lines BLej and odd-numbered bit lines BLoj with the $0^{th}$ bit line set as a reference. That is, the data write operations or read operations are simultaneously performed for 4256 memory cells MC connected to the even-numbered bit lines BLej among the 8512 memory cells MC connected to one word line WLi_mi. Likewise, the data write operations or read operations are simultaneously performed for 4256 memory cells MC connected to the odd-numbered bit lines BLoj. When each memory cell MC stores 1-bit data, a unit of "page" is configured by 4256 memory cells MC. That is, when 2-bit data is stored in one memory cell MC, 4256 memory cells MC store data of two pages.

Figure 4:
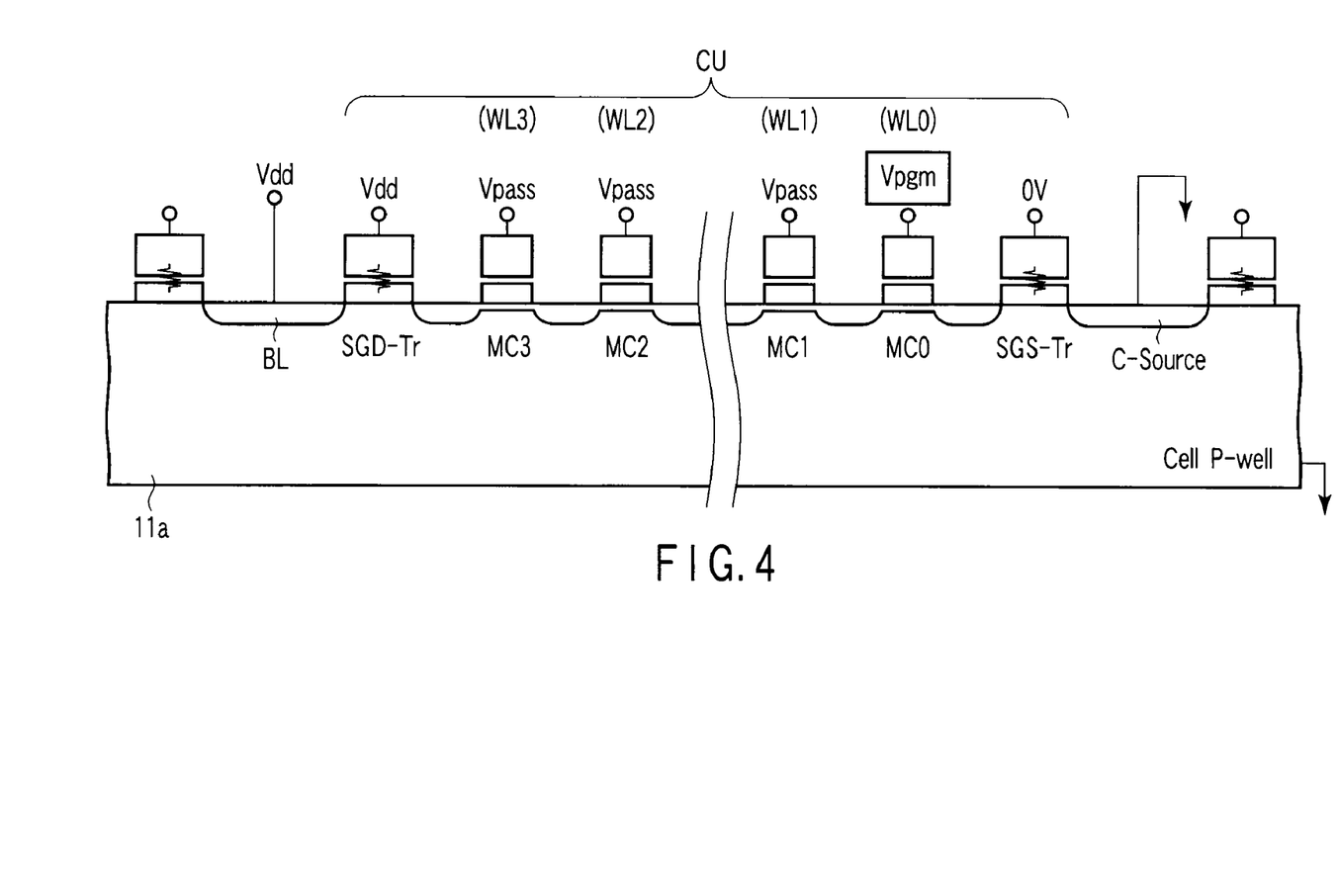
FIG. 4 is a cross-sectional view of a NAND memory cell unit showing a write model.

FIG. 4 shows a write model when the write operation is performed. In this example, a case wherein a "1" write operation is performed for memory cell MC0 connected to word line WL0 is explained. The write model corresponds to the cross section of one of the NAND memory units CU shown in FIG. 3.

That is, on the surface portion of a p-type well (Cell P-well) 11a formed on a semiconductor substrate (not shown), four memory cells MC0 to MC3 and two select gate transistors SGD-Tr, SGS-Tr configuring a NAND memory unit CU are formed. A plurality of NAND memory units CU are arranged in a column direction and row direction to configure a memory cell array (blocks BLOCKm0 to BLOCKm1023) 11.

The sources and drains of memory cells MC0 to MC3 are formed on the surface portions of the p-type well 11a which correspond to portions lying between the respective gate electrodes of memory cells MC0 to MC3 and select gate transistors SGD-Tr, SGS-Tr in the column direction. A NAND channel region is formed of the sources and drains of memory cells MC0 to MC3 and channels lying under the respective gate electrodes.

One of the bit lines BL is formed on the surface portion of the p-type well 11a that lies on the opposite side of memory cell MC3 with respect to the gate electrode of the select gate transistor SGD-Tr in the column direction. The common source line C-Source is formed on the surface portion of the p-type well 11a that lies on the opposite side of memory cell MC0 with respect to the gate electrode of the select gate transistor SGS-Tr in the column direction.

With the above configuration, when a "1" write operation is performed for memory cell MC0, first, a precharge operation of potential Vdd from the column control circuit 12 to the bit line BL is performed. After this, potential Vpgm is applied to word line WL0 and potential Vpass is applied to word lines WL1 to WL3 from the row control circuit 13. As a result, the channel potential is boosted to set the NAND channel region into an electrically floating state. Further, the channel potential is raised to approximately 7 to 10 V (Vchannel) by coupling of Vpgm/Vpass. Therefore, the write operation in memory cell MC0 to which potential Vpgm is applied is not performed, that is, electrons are not injected into the floating gate of the gate electrode (word line WL0) of memory cell MC0.

Figure 5:
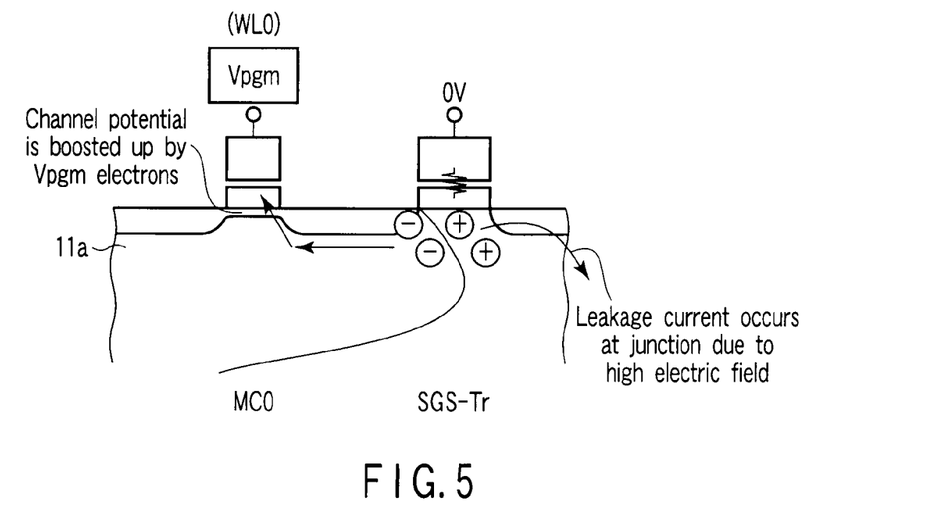
FIG. 5 is a cross-sectional view of a cell showing a faulty model due to erroneous writing.

FIG. 5 shows a faulty model caused by erroneous writing when "1" is written into memory cell MC0.

As described above, in the case of the NAND flash memory with the above configuration, electrons are not injected into the floating gate at the "1" write time. However, electrons are generated on the source side of word line WL0 due to GIDL or source-side injection and the electrons are attracted by high gate voltage of word line WL0. Then, electrons are injected into the floating gate of word line WL0 and, as a result, an erroneous write operation occurs in memory cell MC0.

Such a phenomenon mainly occurs in memory cell MC0 connected to word line WL0. That is, when the write operation is performed for memory cell MC0, generally, the write operations with respect to memory cells MC1 to MC3 connected to the succeeding word lines WL1 to WL3 are not performed. Therefore, a cell that obstructs formation of a channel is not provided and this is considered because boost voltage of word line WL0 is temporarily set to excessively high voltage. The operation of enhancing the boost voltage causes occurrence of GIDL or source-side injection due to a strong electric field between the channel and the source side and an erroneous write operation in memory cell MC0 is performed.

Figure 6:
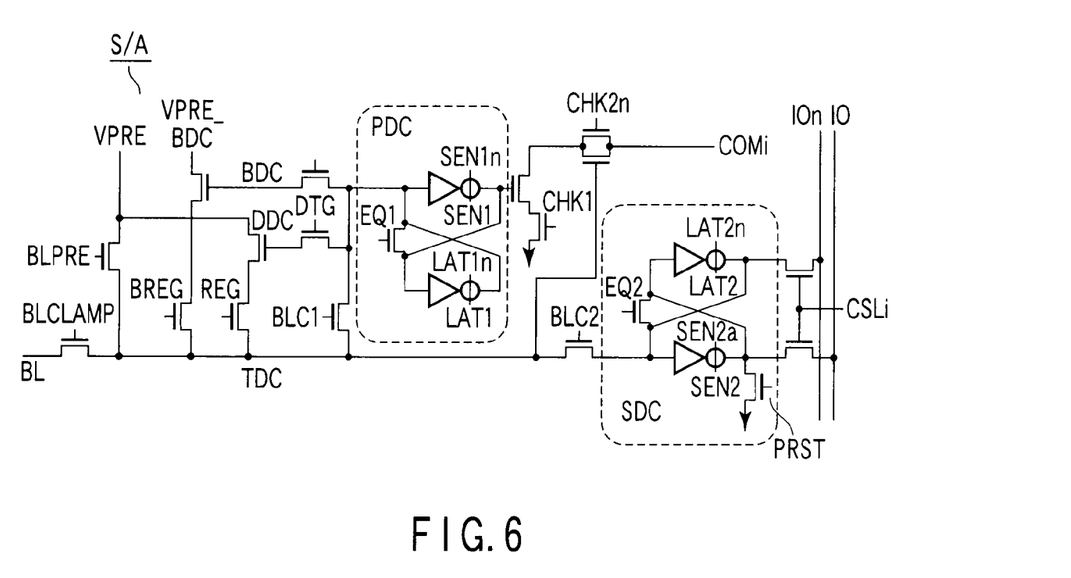
FIG. 6 is a circuit diagram showing an example of the configuration of a sense amplifier.

FIG. 6 shows a configuration example of a sense amplifier provided in the column control circuit 12. A sense amplifier S/A provided for each bit line BL amplifies data read out from memory cells MC0 to MC3 via the bit line BL and holds the same. The sense amplifiers are commonly provided for all of blocks BLOCKm0 to BLOCKm1023.

Figure 7:
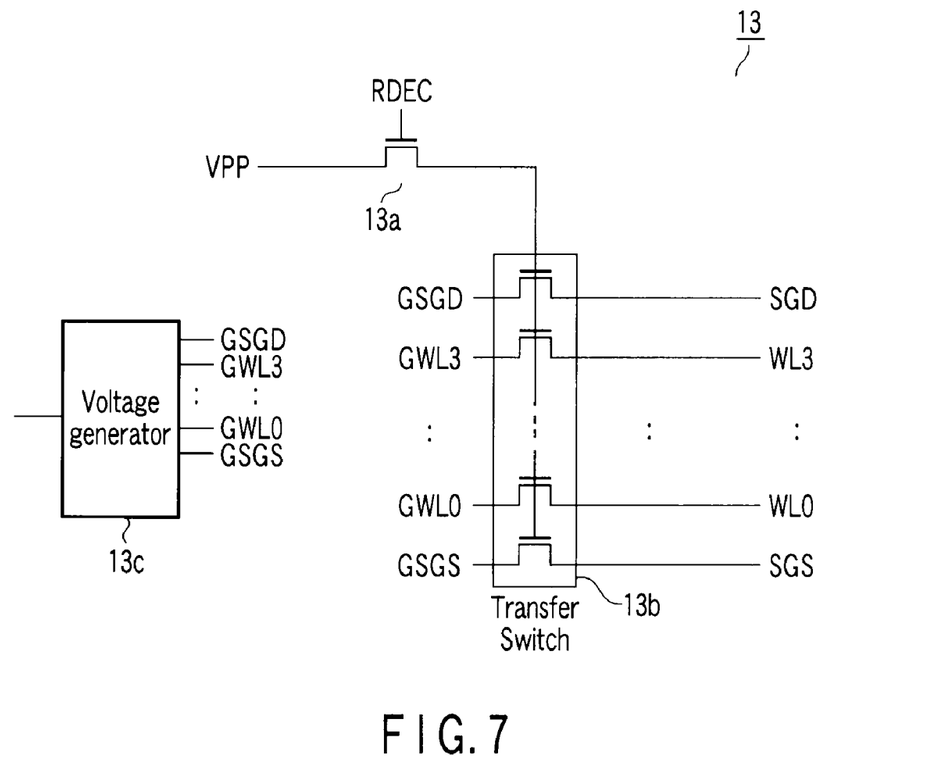
FIG. 7 is a configuration diagram showing one example of a row control circuit.

FIG. 7 shows a configuration example of the row control circuit 13. The row control circuit 13 includes a transfer gate transistor 13a, operation voltage transfer switch (Transfer Switch) 13b, voltage generator 13c and the like. The row control circuit 13 is provided for each of blocks BLOCKm0 to BLOCKm1023.

The operation voltage transfer switch 13b includes six nMOS transistors and controls supply of drain-side control voltage GSGD to the drain-side select gate line SGD, supply of source-side control voltage GSGS to the source-side select gate line SGS and supply of word line control voltages GWL0 to GWL3 to the respective word lines WL0 to WL3. The drain-side control voltage GSGD, source-side control voltage GSGS and word line control voltages GWL0 to GWL3 are generated from the voltage generator 13c.

The voltage generator 13c adequately generates the drain-side control voltage GSGD, source-side control voltage GSGS and word line control voltages GWL0 to GWL3 required for the operation according to the operation.

For example, a row control circuit activation signal RDEC is set to a "high level (H)" by decoding address data from the state machine 18. Then, the transfer gate transistor 13a is turned on to activate (turn on) the operation voltage transfer switch 13b. That is, in the case of a selected block, the transfer gate transistor 13a controls the operation voltage transfer switch 13b to set output potentials thereof to a VPP (transfer gate potential) level. As a result, the operation voltage transfer switch 13b transfers the drain-side control voltage GSGD, word line control voltages GWL0 to GWL3 and source-side control voltage GSGS from the source generator 13c to the drain-side select gate line SGD, word lines WL0 to WL3 and source-side select gate line SGS, respectively.

In the case of a non-selected block, the transfer gate transistor 13a deactivates (turns off) the operation voltage transfer switch 13b. As a result, the operation voltage transfer switch 13b is turned off and inhibits supply of the drain-side control voltage GSGD to the drain-side select gate line SGD, supply of word line control voltages GWL0 to GWL3 to word lines WL0 to WL3 and supply of the source-side control voltage GSGS to the source-side select gate line SGS.

Next, the operation of the NAND flash memory with the above configuration at the "1" write time is explained.

Figure 8:
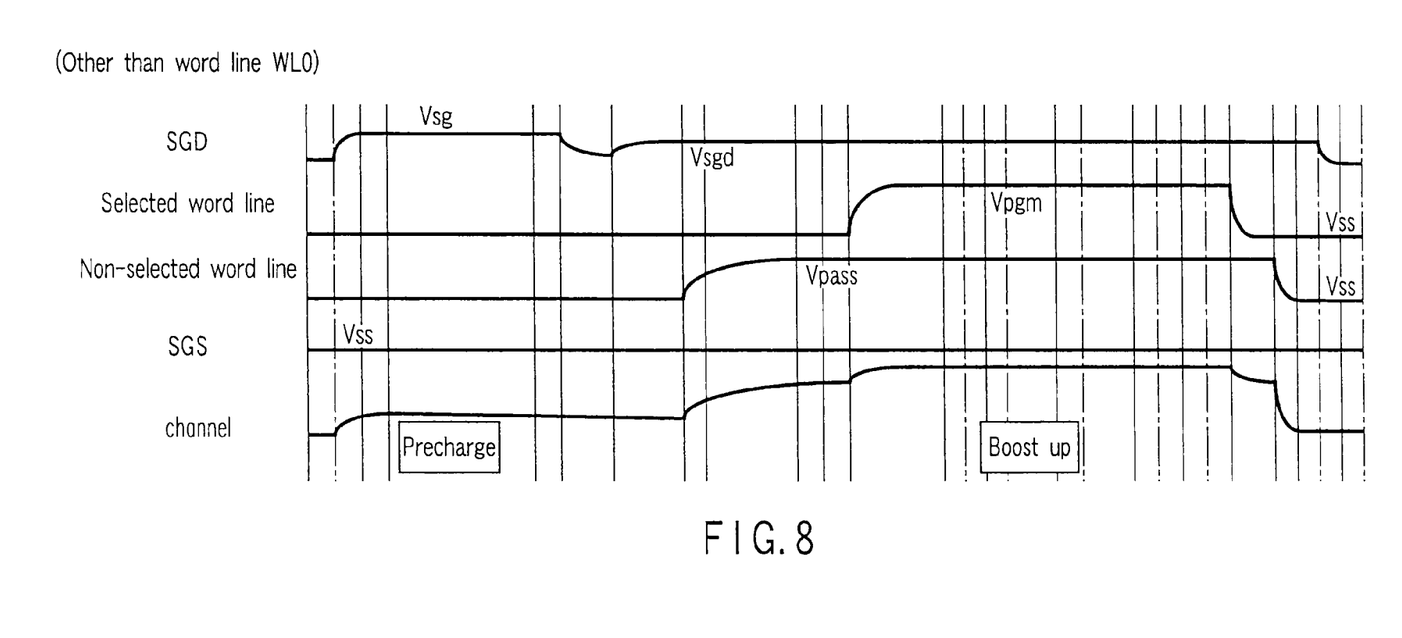
FIG. 8 is a timing chart showing a case wherein a "1" write operation is performed with respect to non-selected cells (MC1 to MC3) as an example.

FIG. 8 shows a case where a "1" write operation is performed for memory cells MC1 to MC3 other than memory cell MC0. First, a precharge operation of potential Vdd from the column control circuit 12 to the bit line BL is performed. After this, potential Vpass is applied to the non-selected word lines from the row control circuit 13 and potential Vpgm is applied to the selected word line. As a result, the channel potential is boosted to perform the "1" write operation for memory cells MC1 to MC3.

In the case of this example, potential Vsg and potential Vsgd from the row control circuit 13 are applied to the drain-side select gate transistor SGD-Tr. Further, potential Vss from the row control circuit 13 is applied to the source-side select gate transistor SGS-Tr.

Thus, as described before, since the possibility that an erroneous write operation due to GILD occurs is weak in memory cells MC1 to MC3 other than memory cell MC0, a "1" write operation is exactly performed by means of the existing method.

Figure 9:
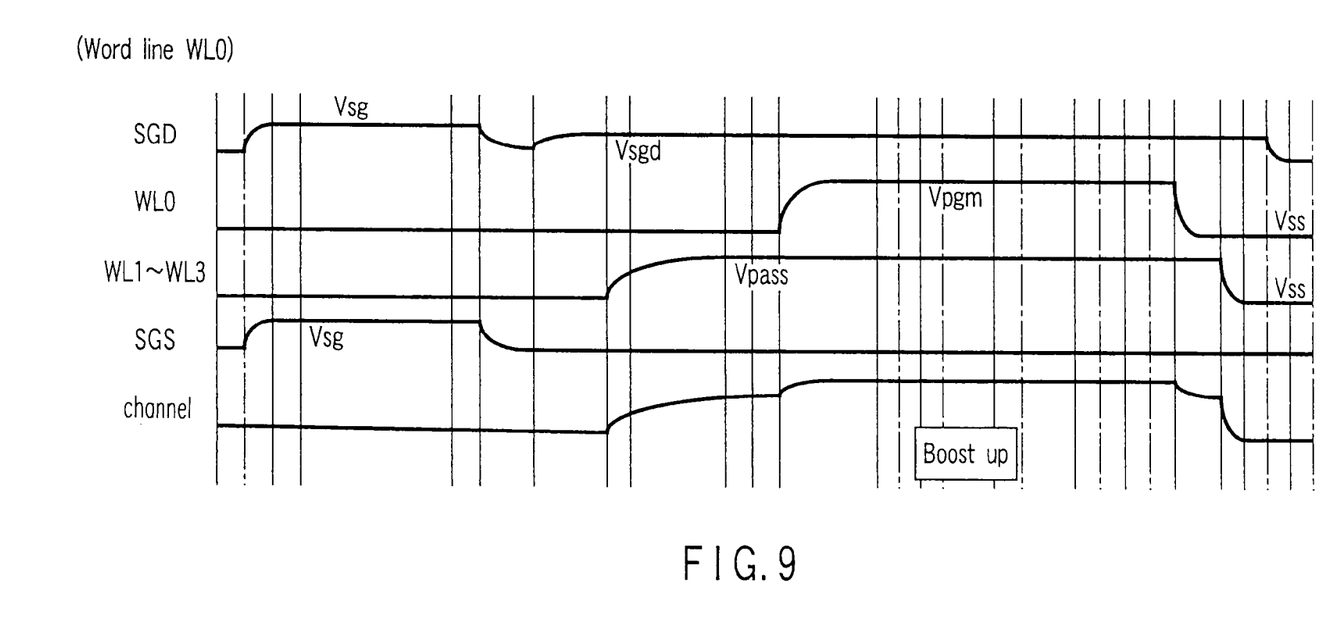
FIG. 9 is a timing chart showing a case wherein a "1" write operation is performed with respect to a non-selected cell (MC0) as an example.

FIG. 9 shows a case wherein a "1" write operation is performed for memory cell MC0 as an example. In this example, a case wherein the source-side select gate transistor SGS-Tr is controlled to lower boost voltage that tends to become excessively high is explained.

First, the drain-side select gate transistor SGD-Tr is turned on by means of potential Vsg from the row control circuit 13 in order to precharge the channel. At the same time, the source-side select gate transistor SGS-Tr is turned on by means of potential Vsg from the row control circuit 13 and discharges the channel potential. As a result, the channel potential becomes zero. After this, the channel potential is boosted by applying potential Vpass from the row control circuit 13 to word lines WL1 to WL3 and applying potential Vpgm to word line WL0.

In this case, the channel potential of memory cell MC0 at the boost voltage application time can be lowered by an amount of precharge potential in comparison with a case of FIG. 8 and occurrence of an erroneous write operation due to GIDL can be suppressed. That is, the channel potential is finally boosted by the boost voltage that is lower by an amount of precharge potential and an exact "1" write operation for memory cell MC0 can be realized.

As described above, in the NAND flash memory, the channel precharge operation performed in the initial period of the write operation is controlled by means of an optimum boost voltage. That is, at the "1" write operation with respect to word line WL0, the channel is precharged and, at the same time, the source-side select gate transistor SGS-Tr is turned on so as not to perform the initial charging operation for the channel. Thus, the channel potential can be finally boosted by means of the boost voltage that is lower by an amount of precharge potential. Therefore, occurrence of an erroneous write operation caused by excessively high boost voltage of the channel can be lowered and the reliability can be enhanced.

Second Embodiment

Figure 10:
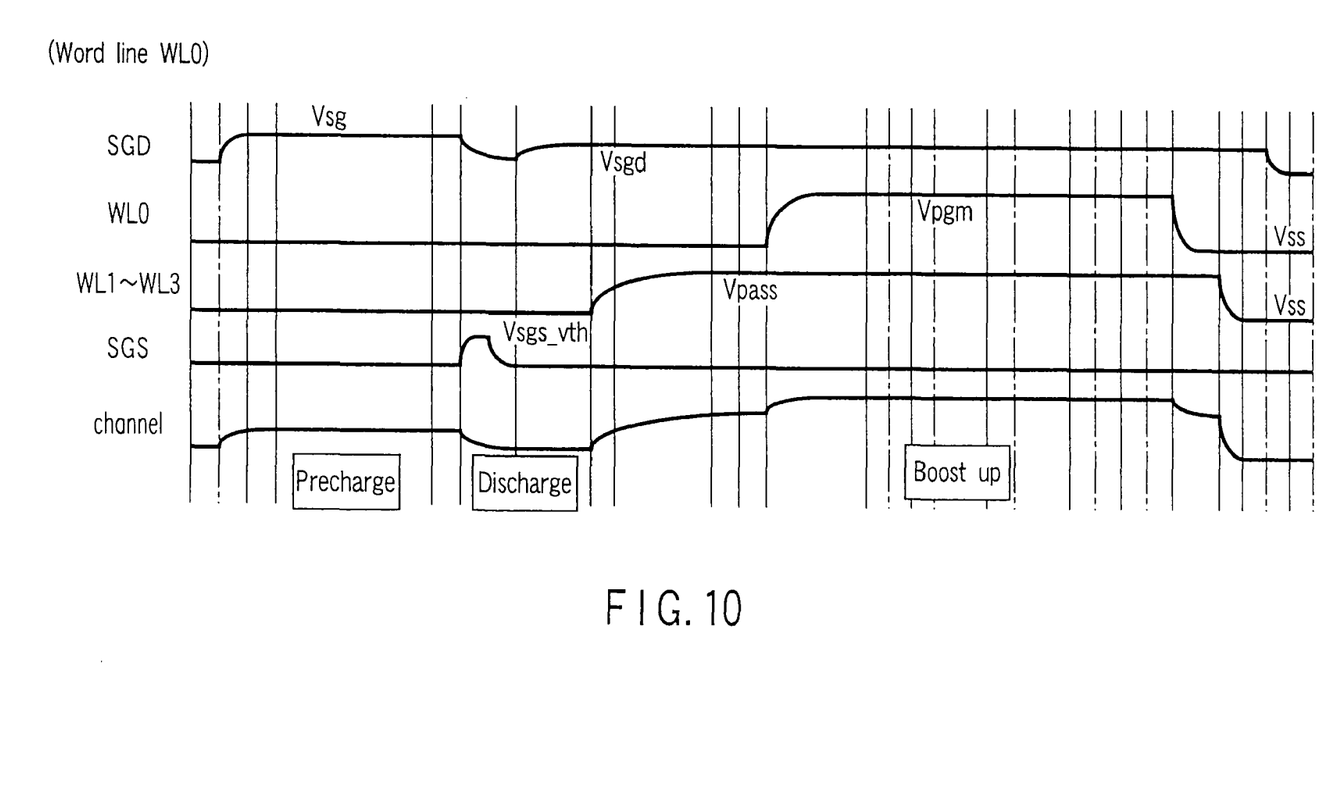
FIG. 10 is a timing chart showing a case wherein a "1" write operation is performed with respect to a non-selected cell (MC0) according to a second embodiment of this invention as an example.

FIG. 10 illustrates a "1" write operation performed in a nonvolatile semiconductor memory device according to a second embodiment of this invention. In the present embodiment, a case wherein a "1" write operation is performed with respect to a memory cell MC0 in a NAND flash memory is explained. In this example, a case wherein a source-side select gate transistor SGS-Tr is controlled to discharge channel precharge potential is explained.

When a word line WL0 is selected, first, a drain-side select gate transistor SGD-Tr is turned on by potential Vsg from a row control circuit 13 to precharge the channel. After this, the source-side select gate transistor SGS-Tr is turned on by potential Vsgs_vth from the row control circuit 13. As a result, the potential precharged on the channel is freely discharged.

Thus, by controlling the boost voltage, an exact "1" write operation for memory cell MC0 is performed while occurrence of an erroneous write operation is suppressed. That is, the boost voltage is finally lowered by an amount corresponding to the potential obtained by freely discharging the precharge potential and, as a result, occurrence of an erroneous write operation due to GIDL or the like can be suppressed.

It is preferable to freely control potential Vsgs_vth and time at which the source-side select gate transistor SGS-Tr is turned on.

The channel discharge amount can be variably changed not only by controlling the potential (Vsgs_vth) of the source-side select gate transistor SGS-Tr by means of the row control circuit 13 but also, for example, by controlling the potential of a common source line C-Source by means of a source line control circuit 14.

Thus, the boost voltage can be optimized by discharging part of the precharged channel potential and occurrence of an erroneous write operation due to excessively high boost voltage can be suppressed.

Third Embodiment

Figure 11:
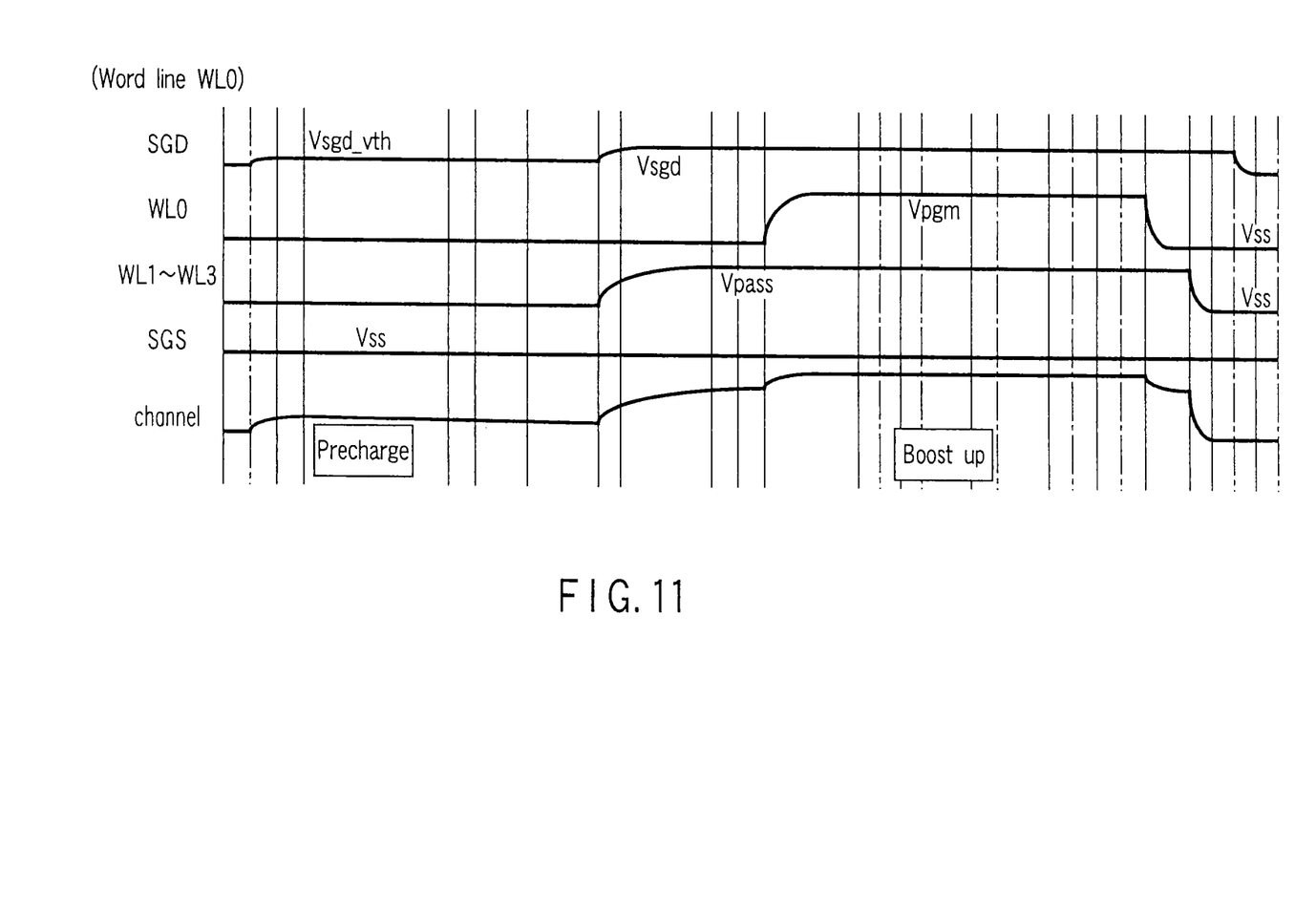
FIG. 11 is a timing chart showing a case wherein a "1" write operation is performed with respect to a non-selected cell (MC0) according to a third embodiment of this invention as an example.

FIG. 11 illustrates a "1" write operation in a nonvolatile semiconductor memory device according to a third embodiment of this invention. In the present embodiment, a case wherein a "1" write operation is performed with respect to a memory cell MC0 in a NAND flash memory is explained. In this example, a case wherein a drain-side select gate transistor SGD-Tr is controlled to control boost voltage (initial charging voltage of the channel) is explained.

When a word line WL0 is selected, first, the drain-side select gate transistor SGD-Tr is turned on to precharge the channel. At this time, the channel precharge potential can be controlled by changing the gate voltage of the drain-side select gate transistor SGD-Tr.

For example, when potential is transferred from a bit line BL to the channel, potential Vsgd_vth is supplied from a row control circuit 13 as the gate voltage of the drain-side select gate transistor SGD-Tr. Thus, the channel can be precharged to "potential (Vsgd_vth–Vth [threshold voltage of the transistor SGD-Tr])". After this, potential Vsgd is applied and, at the same time, desired potentials (Vpgm, Vpass) are applied to word lines WL0 to WL3 to boost the channel potential.

According to the present embodiment, for example, the boost voltage can be lowered by a difference in the precharge potential in comparison with a case of FIG. 8 and occurrence of an erroneous write operation due to GIDL or the like can be suppressed. That is, the initial charging voltage of the channel can be controlled by freely setting the precharge potential and the boost voltage can be optimized. As a result, an exact "1" write operation with respect to memory cell MC0 can be attained by finally boosting the channel potential by means of a boost voltage that is lower by a difference in the precharge potential.

The potential at the precharge time and the bit line potential set after this can be independently controlled by controlling potential Vsgd_vth independently from potential Vsgd applied later to the drain-side select gate transistor SGD-Tr.

Further, a lowering in the boost voltage can be prevented by supplying potential Vsgd applied to the drain-side select gate transistor SGD-Tr after potential Vpass is raised.

In this case, like the above case, the initial charging voltage of the channel can also be controlled by means of a sense amplifier S/A. For example, the boost voltage can be optimized and occurrence of an erroneous write operation caused by GIDL or the like can be suppressed by controlling the signals BLC1, BLCLAMP of the sense amplifier S/A.

Fourth Embodiment

Figure 12:
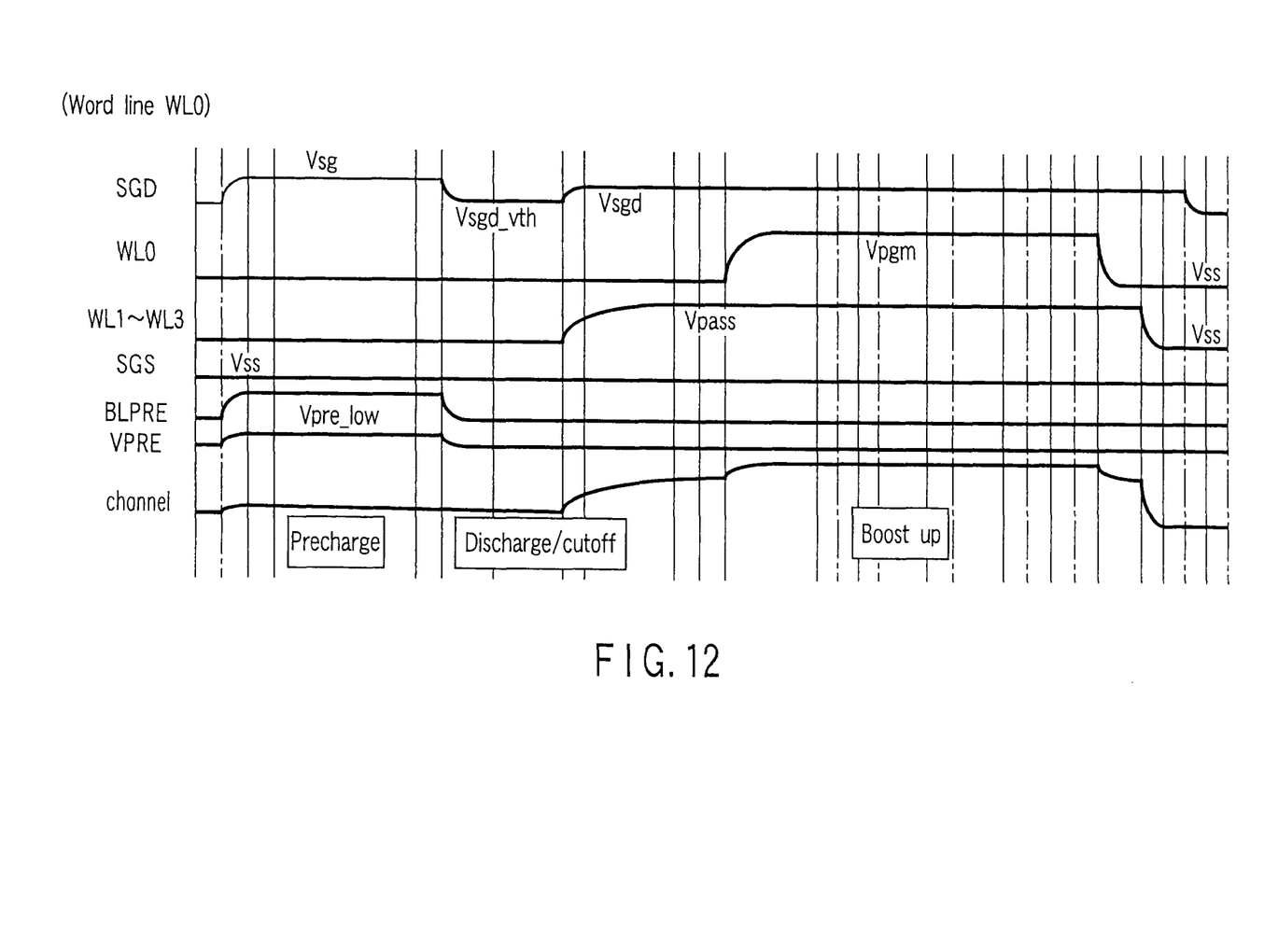
FIG. 12 is a timing chart showing a case wherein a "1" write operation is performed with respect to a non-selected cell (MC0) according to a fourth embodiment of this invention as an example.

FIG. 12 illustrates a "1" write operation in a nonvolatile semiconductor memory device according to a fourth embodiment of this invention. In the present embodiment, a case wherein a "1" write operation is performed with respect to a memory cell MC0 in a NAND flash memory is explained. In this example, a case wherein boost voltage is optimized by variably charging the precharge potential is explained.

When a word line WL0 is selected, first, potential Vsg is supplied from a row control circuit 13 to a drain-side select gate transistor SGD-Tr. At the same time, for example, potential Vpre_low is applied as a signal VPRE of a sense amplifier S/A (supply voltage to the sense amplifier S/A). Thus, the channels of all of the selected NAND strings CU are precharged to potential Vpre_low.

After this, potential Vsgd_vth is supplied from the row control circuit 13 to the drain-side select gate transistor SGD-Tr. At this time, the precharge potential is set to satisfy the condition of "Vsgd_vth–C-source (0V)>threshold voltage of SGD-Tr" in memory cells MC1 to MC3 in which data items are to be written to discharge the channel potential to zero. Further, in memory cell MC0 in which data is not to be written, the precharge potential is set to satisfy the condition of "Vsgd_vth–C-source (channel potential Vpre_low) <threshold voltage of SGD-Tr" to cut off the drain-side select gate transistor SGD-Tr.

By the above operation, the boost voltage of the non-written memory cell MC0 can be lowered by a difference in the precharge potential in comparison with a case of FIG. 8, for example, and occurrence of an erroneous write operation caused by GIDL or the like can be suppressed. That is, an exact "1" write operation with respect to memory cell MC0 can be performed by finally boosting the channel potential by means of a boost voltage that is lower by a difference in the precharge potential.

In the case of the present embodiment, since all of the selected cells (channels) can be blindly charged, it becomes unnecessary to perform a complicated control operation. That is, since it is unnecessary to separate a cell which must be precharged and a cell which must be controlled to 0 V, the control operation can be simplified.

In each of the above embodiments, in the state in which data is not written into memory cells MC1 to MC3 connected to word lines WL1 to WL3 following after word line WL0, occurrence of an erroneous write operation due to excessively high boost voltage of the channel can be suppressed and the reliability can be enhanced when a "1" write operation is performed with respect to memory cell MC0 connected to word line WL0.

In each of the above embodiments, a case wherein the NAND flash memory is taken as an example is explained but, of course, the configuration of the NAND flash memory is not limited to those of the above embodiments.

Further, this invention is not limited to the write operation with respect to the cell MC0 connected to word line WL0 and, for example, it can be applied to all of the word lines in which erroneous write operations due to excessively high boost voltage may occur.

In addition, this invention is not limited to the NAND flash memory but can be similarly applied to a NOR flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array including a plurality of memory cell units, each of the memory cell units having a first select gate transistor connected to a bit line, a second select gate transistor connected to a source line, a first memory cell transistor located between the first and second select gate transistors and adjacent to the second select gate transistor, and a second memory cell transistor located between the first select gate transistor and the first memory cell transistor; and
   a voltage control circuit controlling an initial charging voltage of a channel,
   wherein the voltage control circuit
   turns on the first select gate transistor without turning on the second select gate transistor so as to precharge the channel when a first write operation is performed for the second memory cell transistor, and
   turns on the first and second select gate transistors so as not to perform an initial charging operation for the channel when a second write operation is performed for the first memory cell transistor.

2. The nonvolatile semiconductor memory device according to claim 1, wherein the voltage control circuit is a row control circuit which controls the channel potential to zero by turning on the second select gate transistor when the channel is precharged at the second write operation.

3. The nonvolatile semiconductor memory device according to claim 1, wherein the voltage control circuit is a row control circuit which freely discharges the channel potential by variably changing gate voltage of the second select gate transistor and application time of the gate voltage after the channel is precharged at the second write operation.

4. The nonvolatile semiconductor memory device according to claim 1, wherein the voltage control circuit is a source line control circuit which controls a potential of a cell source line connected to the second select gate transistor and freely discharges the channel potential after the channel is precharged at the second write operation.

5. The nonvolatile semiconductor memory device according to claim 1, wherein the voltage control circuit controls the initial charging voltage of the channel.

6. The nonvolatile semiconductor memory device according to claim 5, wherein the voltage control circuit is a row control circuit which freely sets a precharge potential of the channel by variably changing gate voltage of the first select gate transistor and application time of the gate voltage when the channel is precharged at the second write operation.

7. The nonvolatile semiconductor memory device according to claim 6, wherein the row control circuit controls potential Vsgd_vth applied to a gate of the first select gate transistor independently from potential Vsgd applied later to the gate of the first select gate transistor (where potential Vsgd_vth<potential Vsgd) at the second write operation.

8. The nonvolatile semiconductor memory device according to claim 7, wherein the row control circuit supplies potential Vsgd after potential Vpass applied to a non-selected word line is raised at the second write operation.

9. The nonvolatile semiconductor memory device according to claim 5, wherein the voltage control circuit includes a sense amplifier which freely sets a precharge potential of the channel by controlling a supply voltage to the sense amplifier when the channel is precharged, and the voltage control circuit includes a row control circuit which applies potential Vsgd_vth to a gate of the first select gate transistor after a precharge potential of the channel is set at the second write operation.

10. The nonvolatile semiconductor memory device according to claim 9, wherein a precharge potential of a to-be-written memory cell is set to satisfy a condition of "Vsgd_vth-C-Source (0 V)>threshold voltage of the first select gate transistor" by supplying potential Vsgd_vth and the channel potential is discharged to zero.

11. The nonvolatile semiconductor memory device according to claim 9, wherein a precharge potential of a memory cell which is not to be written is set to satisfy a condition of "Vsgd_vth-C-Source (precharge potential of channel) <threshold voltage of the first select gate transistor" by supplying potential Vsgd_vth and the first select gate transistor is cut off.

12. The nonvolatile semiconductor memory device according to claim 1, wherein a "1" write operation with respect to the memory cell is a "1" write operation with respect to the memory cell connected to an adjacent word line which is performed in a state in which a write operation with respect to memory cells connected to word lines other than the adjacent word line lying adjacent to the second select gate transistor among the word lines connected to the preset number of memory cells is not yet performed.

* * * * *